United States Patent [19]
Miyawaki et al.

[11] Patent Number: 5,536,907
[45] Date of Patent: Jul. 16, 1996

[54] SEMICONDUCTOR PACKAGE

[75] Inventors: Katumi Miyawaki; Tosio Usuki, Itami, both of Japan

[73] Assignee: Mitsubishi Denki Kabushiki Kaisha, Tokyo, Japan

[21] Appl. No.: 341,151

[22] Filed: Nov. 16, 1994

[30] Foreign Application Priority Data

Dec. 1, 1993 [JP] Japan .................................. 5-301364

[51] Int. Cl.$^6$ ................................................. H01L 23/02
[52] U.S. Cl. ........................ 174/52.4; 174/263; 257/692; 361/760
[58] Field of Search .................... 174/52.1–52.4, 174/259, 260, 263; 257/690, 692, 700, 703, 706; 361/760, 772; 29/830, 832

[56] References Cited

U.S. PATENT DOCUMENTS

| 4,866,571 | 9/1989 | Butt ............................................ 361/386 |
| 5,095,359 | 3/1992 | Tanaka et al. ............................. 357/74 |

*Primary Examiner*—Kristine L. Kincaid
*Assistant Examiner*—Robert J. Decker
*Attorney, Agent, or Firm*—Leydig, Voit & Mayer

[57] ABSTRACT

A semiconductor package includes a package body, a semiconductor chip disposed on the surface of the package body, external lead terminals disposed on two opposite side surfaces of the package body, a lid hermetically sealing and shielding the semiconductor chip in the package body, a package substrate having a metallized region on which the package body is mounted, and a metal layer disposed on the rear surface of the package body and connected to the metallized region of the package substrate with solder. The metal layer includes material having a good adhesion to the solder and has a pattern in which stripe-shaped metal portions abut two opposite side surfaces of the package body where the external lead terminals are absent, and stripe-shaped openings that abut the respective metal portions. Therefore, when the package body is soldered to the package substrate, unwanted flow of the melted solder is stopped at the openings in the metal layer. Therefore, solder fillets are surely produced on the side surfaces of the package body where the external lead terminals are absent, whereby the connection condition can be determined by visual inspections of the solder fillets.

17 Claims, 12 Drawing Sheets

SEMICONDUCTOR PACKAGE

FIELD OF THE INVENTION

The present invention relates to a semiconductor package containing a high-frequency and high-output IC and mounted on an external package substrate. More particularly, the invention relates to a structure of a metal film disposed on a rear surface of the semiconductor package and used for soldering of the package body to the package substrate.

BACKGROUND OF THE INVENTION

FIG. 10(a) is a perspective view illustrating an external structure of a prior art semiconductor package, FIG. 10(b) is a sectional view taken along a line 10b—10b of FIG. 10(a), and FIG. 10(c) is a sectional view taken along a line 10c—10c of FIG. 10(a). FIG. 11(a) is a perspective view illustrating an internal structure of the semiconductor package, FIG. 11(b) is an enlarged view of a portion "A" of FIG. 10(b), and FIG. 11(c) is a plan view illustrating a front surface of a package substrate on which the semiconductor package is to be mounted. FIG. 12 is an exploded perspective view of the semiconductor package. FIG. 13(a) is a perspective view illustrating a rear surface of the semiconductor package.

In these figures, reference numeral 200 designates a semiconductor package containing a semiconductor chip 29 and mounted on a package substrate (printed board) 1. The semiconductor package 200 includes a plurality of external lead terminals 5 arranged on prescribed opposite sides of the package 200, a package body 201 containing the semiconductor chip 29, and a lid 4 comprising a metal plate. The lid 4 covers an opening of the package body 201 and hermetically seals the semiconductor chip 29 in the package body 201.

The package body 201 includes a base substrate 3 having opposite front and rear surfaces. Ground conductors 3a and 3b are disposed on the front surface and the rear surface of the base substrate 3, respectively. A plurality of through-holes 22 penetrate through the base substrate 3 and connect the front side ground conductor 3a to the rear side ground conductor 3b. A semiconductor chip 29 is disposed on the front side ground conductor 3a. A first ceramic frame 20 is disposed on the front surface of the base substrate 3, surrounding the semiconductor chip 29. A plurality of conductive layers 20a are disposed on the surface of the first ceramic frame 20. A second ceramic frame 21 is disposed on the first ceramic frame 20. A metal film 21a is disposed on the second ceramic frame 21. The external lead terminals 5 are soldered to portions of the conductive layers 20a on the first ceramic frame 20 outside the second ceramic frame 21. The lid 4 is soldered to the second ceramic frame 21 with a solder 33.

As shown in FIG. 11(b), the conductive layer 3b on the rear surface of the base substrate 3 comprises a metallized layer 111 in contact with the base substrate, a plated Ni layer 112 disposed on the metallized layer 111, and a plated Au layer 113 disposed on the plated Ni layer 112. The size of the base substrate 3 is the same as the size of the ceramic frame 20. On the side surfaces of the base substrate 3 and the ceramic frame 20 where the external lead terminals 5 are absent, metal films 3c and 20b are disposed, respectively. These metal films 3c and 20b have the same layer structure as the conductive layer 3b.

In the semiconductor package 200 having the above-described structure, as shown in FIG. 11(a), the semiconductor chip 29 is fixed to the conductive layer 3a on the front surface of the base substrate 3 with solder 31, and the chip 29 is connected to the external lead terminals 5 through bonding wires 30.

Further, as illustrated in FIG. 11(c), a solder land 2 comprising a metallized layer is disposed on a region of the package substrate 1 where the semiconductor package 200 is to be mounted. A plurality of conductive layers 25 are disposed on the package substrate 1 at positions opposite the external lead terminals 5 of the semiconductor package 200. When the semiconductor package 200 is mounted on the package substrate 1, the external lead terminals 5 are in contact with the respective conductive layers 25. Solder films are printed on the solder land 2 and on the conductive layers 25.

A description is given of the fabrication process of the semiconductor package 200.

Initially, the base substrate 3 having the conductive layers 3a, 3c, and 3b on the front, side, and rear surfaces, respectively, and the through-holes 22 connecting the conductive layer 3a on the front surface to the conductive layer 3b on the rear surface is prepared. Then, the second ceramic frame 21 having the metal film 21a on its front surface is put on the first ceramic frame 20 with the conductive layers 20a and 20b respectively on the front and side surfaces, and the first ceramic frame 20 is put on the base substrate 3, followed by baking to fix the frames on the base substrate 3 (refer to FIG. 12).

Thereafter, the external lead terminals 5 are connected to the conductive layers 20a of the first ceramic frame 20 with solder, completing the package body 201.

Generally, the semiconductor package body 201 is offered to users, and a semiconductor chip is mounted on the semiconductor package at the user's end.

More specifically, at the user's end, the semiconductor chip 29 is put on the package body 201 so that the chip 29 is in contact with the conductive layer 3a of the base substrate 3, and the chip 29 is fixed to the base substrate 3 with solder 31. The semiconductor chip 29 is connected to the external lead terminals 5 of the package 200 with bonding wires 30. Thereafter, the package lid 4 is soldered to the second ceramic frame 21, whereby the semiconductor chip 29 is hermetically sealed in the semiconductor package 200.

The semiconductor package 200 is positioned on the solder land 2 of the package substrate 1 so that the external lead terminals 5 are in contact with the corresponding conductive layers 25 at the end portions of the conductive layers 25. Thereafter, the solder land 2 and the solder layers 6 on the conductive layers 25 are melted by thermal treatment, whereby the semiconductor package 200 is fixed to the solder land 2 and the external lead terminals 5 are fixed to the conductive layers 25.

After the above-described mounting process, whether the connection between the semiconductor package 200 and the package substrate 1 through the solder 6 is good or bad is determined by inspecting for the inspected by existence of solder fillets 9 on the both sides of the package where external lead terminals 5 are absent. More specifically, since Au having a good adhesion with the solder is plated on the conductive layer 3c on the side surface of the package 200, if the conductive layer 3b on the rear surface of the package 200 is in good contact with the solder land 2 of the package substrate 1, the solder swells at the side surface of the package due to surface tension, so that the solder fillet 9 is produced.

The reason why the above-described inspection of the connection between the semiconductor package 200 and the package substrate 1 is necessary is as follows. If the adhesion between the rear side conductive layer 3b of the package body 201 and the solder land 2 of the package substrate 1 is insufficient, the package body is not in good contact with the package substrate 1, so that the contact resistance increases. In addition, radiation of heat produced in the semiconductor chip 29 is degraded, whereby the semiconductor chip 29 is excessively heated, resulting in imperfect oscillation and degraded high-frequency characteristics of the semiconductor device.

In the above-described prior art semiconductor package 200, since the plated Au layer 113 on the conductive layer 3b disposed on the rear surface of the package body 201 has good adhesion to solder, when the semiconductor package 200 mounted on the solder land 2 of the package substrate 1 is subjected to thermal treatment, the solder. 6 printed on the solder land 2 melts and unfavorably flows toward the center of the rear surface of the package body 201, so that the solder fillet 9 for the quality inspection is not produced on the side surface of the semiconductor package 200.

This unwanted flow of the solder on the rear surface of the semiconductor package is a result of the plated Au layer 113 on the rear surface of the package body that is partially decreased due to diffusion of Au into the solder layer 6, and the solder 6 flows into that portion of the plated Au layer 113. In this case, as shown in FIG. 13(b), the solder 6 does not protrude at the side surface of the package body where the conductive layers 3c and 20b are present, and the solder fillet 9 is not produced.

As the result, after the mounting of the semiconductor package 200 on the package substrate 1, the adhesion between the conductive layer 3b on the rear surface of semiconductor package and the solder land 2 on the front surface of the package substrate 1 cannot be inspected, thereby reducing the reliability of the semiconductor device.

SUMMARY OF THE INVENTION

An object of the present invention is to provide a semiconductor package in-which the adhesion between the conductive layer on the rear surface of the package body and the solder land on the front surface of the package substrate can be inspected with high reliability using solder fillets.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor package comprises a package body having opposite front and rear surfaces and four side surfaces, a semiconductor chip disposed on the front surface of the package body, a plurality of external lead terminals for electrically connecting of the semiconductor chip with external elements which are disposed on two opposite side surfaces selected from the four side surfaces of the package body, a lid hermetically sealing and shielding the semiconductor chip in the package body, a package substrate having a metallized region, and a metal layer disposed on the rear surface of the package body and connected to the metallized region of the package substrate with solder. The metal layer comprises material having a good adhesion with the solder and has a prescribed pattern in which stripe-shaped metal portions abut two opposite side surfaces of the package body where the external lead terminals are absent, and stripe-shaped openings of the metal layer abut the respective metal portions. Therefore, when the metal layer on the rear surface of the package body is soldered to the metallized region of the package substrate, although the heated and melted solder flows from the periphery toward the center of the rear surface of the package body, this flow of the solder is stopped at the openings of the metal layer. Therefore, solder fillets are surely produced on the side surfaces of the package body where the external lead terminals are absent, according to the connecting condition between the metal layer of the package body and a solder land of the package substrate, whereby the connecting condition can be inspected visually using the solder fillets.

According to a second aspect of the present invention, in the above-described semiconductor package, a metallized layer is disposed on the rear surface of the package body, and a plated Ni layer is disposed on the metallized layer. In addition, as the metal layer for soldering, an Au layer is selectively plated on the plated Ni layer. Therefore, when the package is soldered to the package substrate, the solder fillets are surely formed. In addition, the plated Ni layer increases the adhesive strength between the plated Au layer for soldering and the metallized layer as a plating base layer on the rear surface of the package body.

According to a third aspect of the present invention, in the above-described semiconductor package, the plated Ni layer has the same pattern as the plated Au layer for soldering. Therefore, when the semiconductor package is mounted on the package substrate, although the heated and melted solder flows from the periphery toward the center of the rear surface of the package body, this flow of the solder is stopped at the openings in which the plated Au layer and the plated Ni layer are absent. Therefore, solder fillets are surely produced, and the connecting condition between the package and the package substrate can be inspected visually using the solder fillets. In addition, the plated Ni layer increases the adhesive strength between the plated Au layer for soldering and the metallized layer as a plating base layer on the rear surface of the package body.

According to a fourth aspect of the present invention, in the above-described semiconductor package, portions of the plated Ni layer exposed in the openings of the metal layer for soldering are coated with a ceramic material. Therefore, when the package is mounted on the package substrate, solder fillets are surely formed. In addition, since the ceramic coating serves as a mask for selective plating of the plated Au layer, it is not necessary to form a mask for the selective plating, whereby the production cost is reduced.

According to a fifth aspect of the present invention, in the above-described semiconductor package, the metal layer for soldering comprises, in addition to the metal portions on the opposite ends of the rear surface of the package body, a metal portion for radiation of heat generated by the semiconductor chip on the front surface of the package body. Therefore, solder fillets are produced with high reliability, and the heat radiation of the semiconductor chip is improved.

According to a sixth aspect of the present invention, in the above-described semiconductor package, in place of the external lead terminals, a plurality of conductive layers for external connection are disposed on the package body, extending from the periphery of the front surface to the periphery of the rear surface of the package body through the side surface of the package body. Therefore, the size of the semiconductor package is reduced compared to a package employing external lead terminals.

According to a seventh aspect of the present invention, in the above-described semiconductor package, the package substrate includes a base substrate comprising a metal, and the semiconductor chip is disposed on the base substrate. Since the base substrate comprises a metal, it is not necessary to form conductive layers for grounding of the semiconductor chip on the front and rear surfaces of the base substrate. In addition, through-holes connecting the front and rear conductive layers are dispensed with. Therefore, the production process of the base substrate is significantly simplified.

According to an eighth aspect of the present invention, in the above-described semiconductor chip, a plated Ni layer is disposed on the rear surface of the metal base substrate, and an Au layer for soldering is selectively plated on the plated Ni layer. Therefore, when the package is mounted on the package substrate, fillets are formed with high reliability. In addition, the plated Ni layer increases the adhesive strength between the plated Au layer for soldering and the rear surface of the package body.

According to a ninth aspect of the present invention, in the above-described semiconductor package, portions of the rear surface of the package body exposed in the openings of the plated Au layer are coated with a ceramic material. Since the ceramic coating serves as a mask for selective plating of the plated Au layer, it is not necessary to form a mask for selective plating, whereby the production cost is reduced.

BRIEF DESCRIPTION OF THE DRAWINGS

FIGS. 1(a)–1(c) are diagrams illustrating a semiconductor package in accordance with a first embodiment of the present invention, in which FIG. 1(a) is a perspective view of the semiconductor package viewed from its rear surface, and FIGS. 1(b) and 1(c) are sectional views of portions of the package.

FIGS. 2(a)–2(d) are diagrams illustrating a semiconductor package in accordance with a second embodiment of the present invention, in which FIG. 2(a) is a perspective view of the semiconductor package viewed from its rear surface, and FIGS. 2(b)–2(d) are sectional views of portions of the package.

FIGS. 3(a)–3(d) are diagrams illustrating a semiconductor package in accordance with a third embodiment of the present invention, in which. FIG. 3(a) is a perspective view of the semiconductor package viewed from its rear surface, and FIGS. 3(b)–3(d) are sectional views of portions of the package.

FIGS. 8(a)–8(d) are diagrams illustrating a semiconductor package in accordance with a seventh embodiment of the present invention, in which FIG. 8(a) is a perspective view of the semiconductor package viewed from its rear surface, and FIGS. 8(b)–8(d) are sectional views of portions of the package.

FIGS. 9(a)–9(d) are diagrams illustrating a semiconductor package in accordance with an eighth embodiment of the present invention, in which FIG. 9(a) is a perspective view of the semiconductor package viewed from its rear surface, and FIGS. 9(b)–9(d) are sectional views of portions of the package.

FIGS. 10(a)–10(c) are diagrams illustrating a semiconductor package according to the prior art, in which FIG. 10(a) is a perspective view of the semiconductor package, and FIGS. 10(b) and 10(c) are sectional-views taken along lines 10b—10b and 10c—10c of FIG. 10(a), respectively.

FIGS. 11(a)–11(c) are diagrams illustrating the semiconductor package according to the prior art, in which FIG. 11(a) is a perspective view showing an internal structure of the package, FIG. 11(b) is a sectional view of a part of the package, and FIG. 11(c) is a plan view showing a front surface of a package substrate.

DETAILED DESCRIPTION OF THE PREFERRED EMBODIMENTS

[Embodiment 1]

Figure 1:
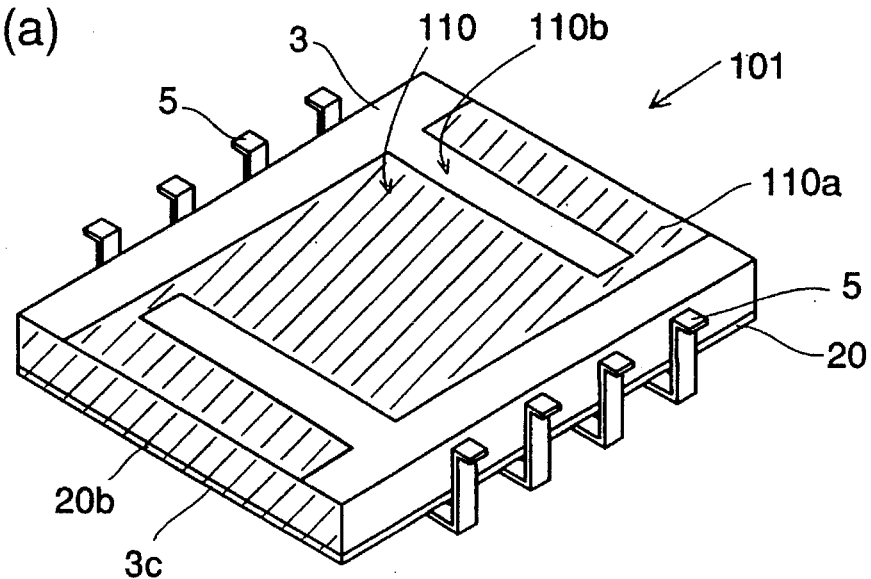
Figure 1:
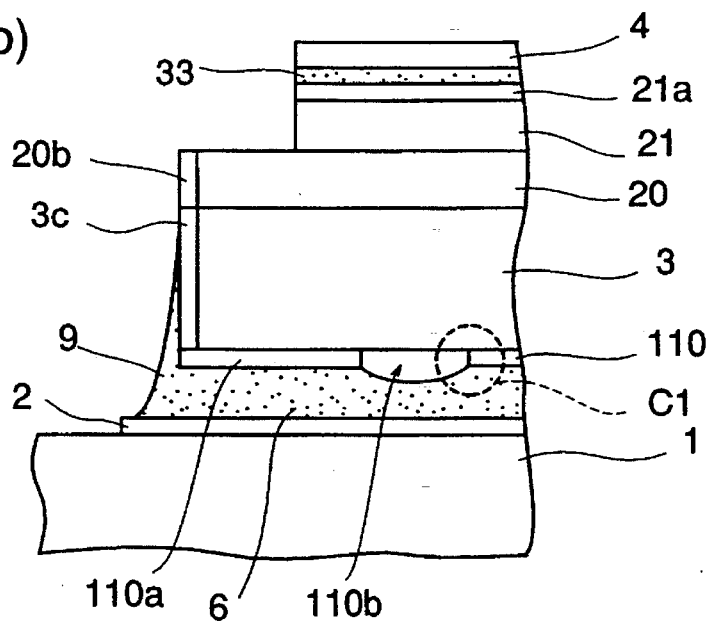
Figure 1:
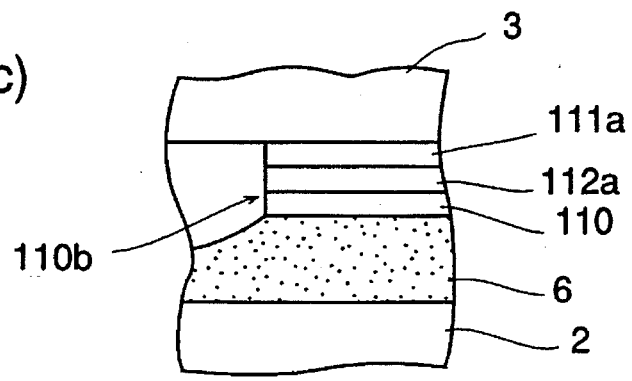

FIGS. 1(a)–1(c) are diagrams illustrating a semiconductor package in accordance with a first embodiment of the present invention, in which FIG. 1(a) is a perspective view of the semiconductor package 101 viewed from its rear surface, FIG. 1(b) is a sectional view of a part of the package in the vicinity of a Junction between the semiconductor package and a package substrate, and FIG. 1(c) is an enlarged view of a part of a metal layer for soldering disposed on the rear surface of the semiconductor package, which part is denoted by C1 in FIG. 1(b).

In the figures, the same reference numerals as those in FIGS. 10(a)–10(c) and 11(a)–11(c) designate the same or corresponding parts. In this first embodiment of the invention, as shown in FIG. 1(c), a metallized layer 111a having a prescribed pattern is formed on the rear surface of the base substrate 3 by printing or baking of a metal paste, such as W or MoMn, and an Ni layer 112a and an Au layer (metal layer for soldering) 110 are selectively plated on the metallized layer 111a.

The plated Au layer 110 includes portions 110a each having a prescribed width and abutting on the side surface of the package body where the external lead terminals 5 are absent. The plated Au layer 110 is absent at portions 110b on the rear surface of the base substrate 3. In other words, the pattern of the plated Au layer 110 has two slits (openings) 110b, each having a prescribed width and abutting the metal portion 110a. In the slits 110b, the base substrate 3 is exposed. Other constituents of the semiconductor package 101 and the fabrication of the semiconductor package 101 are identical to those of the above-described prior art semiconductor package 200.

In this first embodiment of the invention, the plated Au layer 110 on the rear surface of the base substrate 3 has the slits 110b parallel to the side surfaces of the package body where the external lead terminals are absent, and the ceramic surface of the base substrate 3 that has poor adhesion to the solder is exposed in the slits 110b. Therefore, when the plated Au layer 110 on the rear surface of the package is connected to the solder 1 and 2 on the package substrate 1 with the solder 6, the flow of the melted solder 6 from the periphery toward the center of the rear surface of the package is stopped at the slits 110b where the ceramic base substrate 3 is exposed, whereby the unwanted flow of the solder 6 is suppressed. As the result, solder fillets 9 are surely produced on the side surfaces of the semiconductor package 101 where the external lead terminals 5 are absent, and the quality of the semiconductor device can be inspected using the solder fillets 9.

Further, since the plated Au layer 110 is disposed on the metallized layer 111a via the plated Ni layer 112a, the adhesive strength between the plated Au layer 110 and the metallized layer 111a serving as a base layer for plating is increased by the plated Ni layer 112a.

[Embodiment 2]

Figure 2:
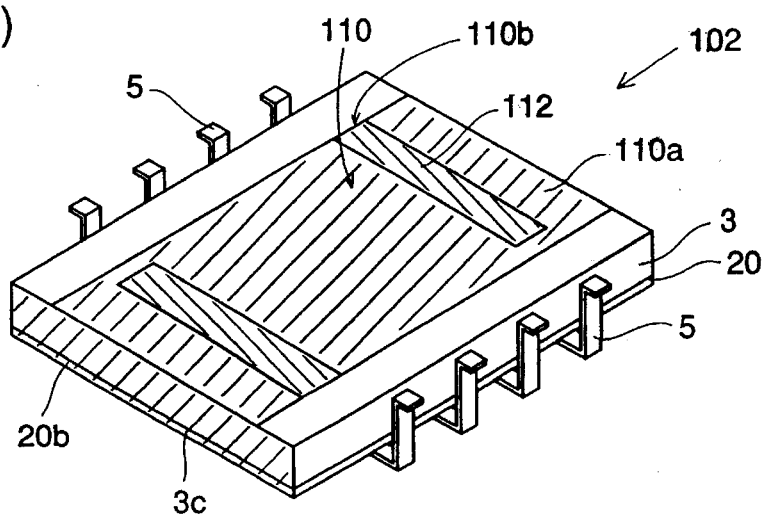
Figure 2:
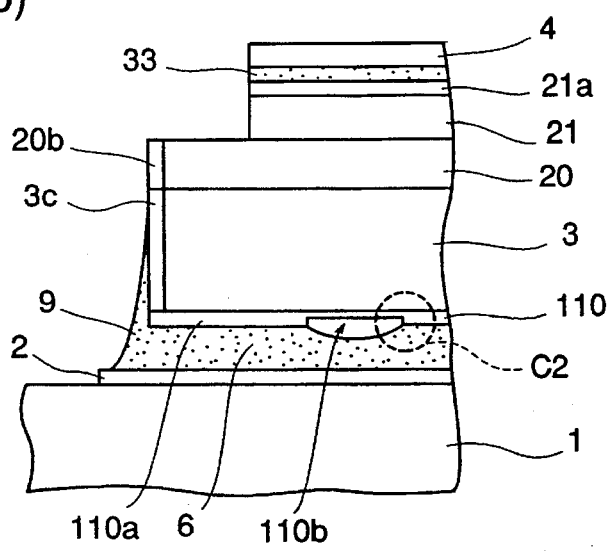
Figure 2:
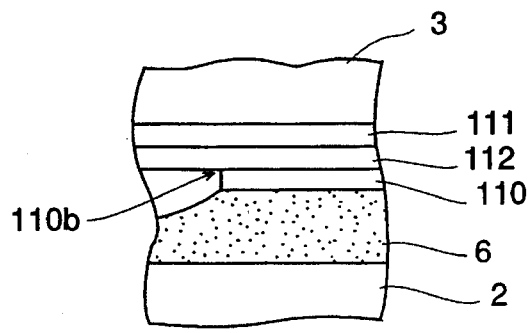
Figure 2:
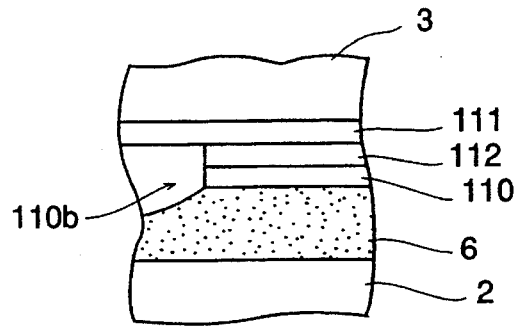

FIGS. 2(a)–2(c) are diagrams illustrating a semiconductor package in accordance with a second embodiment of the present invention, in which FIG. 2(a) is a perspective view of the semiconductor package 102 viewed from its rear surface, FIG. 2(b) is a sectional view of a part of the package in the vicinity of a junction between the package and a package substrate, and FIG. 2(c) is an enlarged view of a part of a metal layer for soldering disposed on the rear surface of the semiconductor package, which part is denoted by C2 in FIG. 2(b). In addition, FIG. 2(d) is a diagram for explaining a variation of the second embodiment.

In the figures, the same reference numerals as in FIGS. 1(a)–1(c) designate the same or corresponding parts. In this second embodiment, a metallized layer 111 is disposed over the rear surface of the base substrate 3, and a plated Ni layer 112 is disposed over the metallized layer 111. The metallized layer 111 is formed by printing or baking of a metal paste, such as W or MoMn. In addition, a metal layer 110 for soldering is disposed on the plated Ni layer 112. The metal layer 110 is a plated Au layer having the same pattern as described in the first embodiment. The plated Ni layer 112 is exposed at the slits 110b of plated Au layer 110.

Also in this second embodiment of the invention, since the plated Ni layer 112 having poor adhesion to solder is exposed at the slits 110b of the plated Au layer 110 for soldering, when the package is mounted on the package substrate, the unwanted flow of the melted solder from the periphery toward the center of the base substrate 3 is stopped at the slits 110b. Therefore, the solder fillets 9 for inspection of the mounting condition are surely produced on the side surfaces of the package.

FIG. 2(d) is a sectional view of a part of a semiconductor package according to a variation of the second embodiment. Although in the above-described second embodiment the plated Ni layer 112 is exposed at the slits 110b of the metal layer 110, the metallized layer 111 may be exposed at the slits 110b. In this case, the plated Ni layer 112 is formed so that it has the same pattern as the plated Au layer 110, thereby the metallized layer 111 is exposed at the slits 110b of the plated Au layer 110.

[Embodiment 3]

Figure 3:
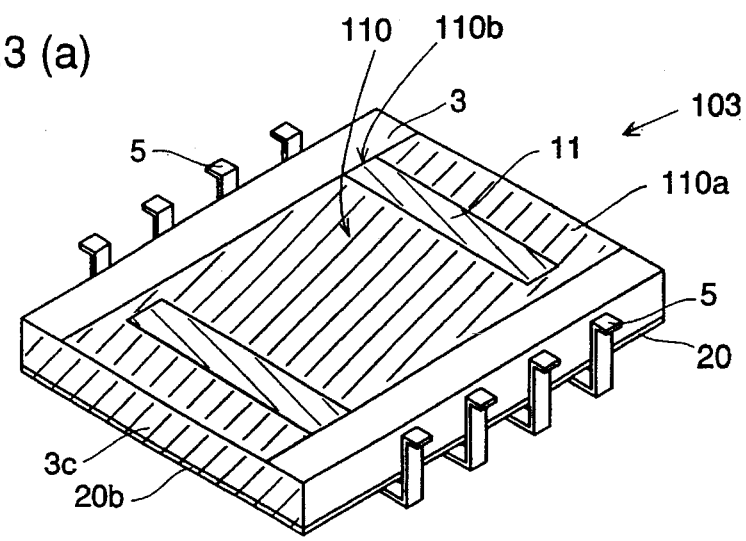
Figure 3:
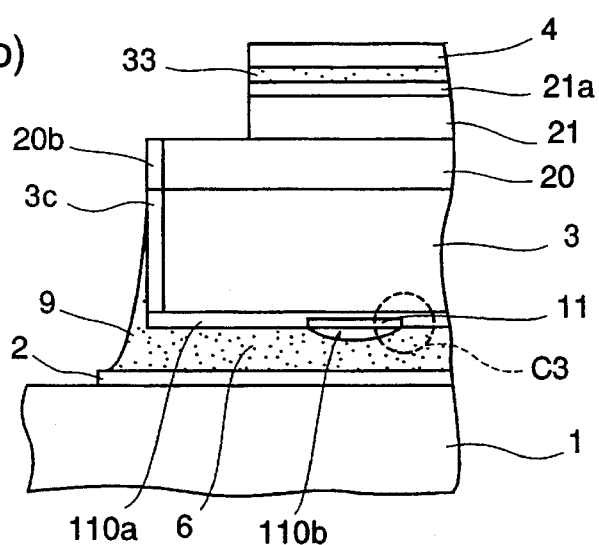
Figure 3:
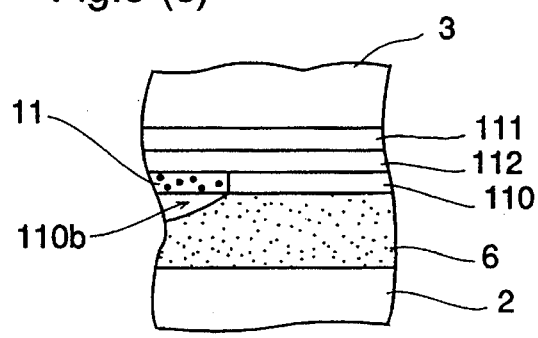
Figure 3:
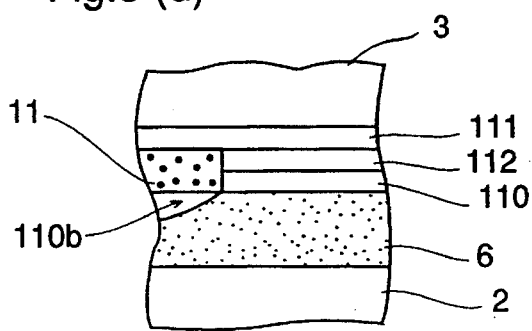

FIGS. 3(a)–3(c) are diagrams illustrating a semiconductor package in accordance with a third embodiment of the present invention, in which FIG. 3(a) is a perspective view of the semiconductor package 103 viewed from its rear surface, FIG. 3(b) is a sectional view of a part of the package in the vicinity of a junction between the semiconductor package and a package substrate, and FIG. 3(c) is an enlarged view of a part of a metal layer for soldering disposed on the rear surface of the semiconductor package, which part is denoted by C3 in FIG. 3(b). In addition, FIG. 3(d) is a diagram for explaining a variation of the third embodiment.

In the figures, the same reference numerals as in FIGS. 2(a)–2(d) designate the same or corresponding parts. In this third embodiment, as in the above-described second embodiment, the metallized layer 111, the plated Ni layer 112, and the plated Au layer 110 having the pattern of FIG. 3(a) are successively disposed on the rear surface of the base substrate 3. In addition, portions of the plated Ni layer 112 exposed at the slits 110b of the plated Au layer 110 are coated with alumina layers 11.

Also in this third embodiment, since the alumina layers 11 that have poor adhesion to solder are disposed in the slits 110a of the plated Au layer 110, when the package is mounted on the package substrate, the unwanted flow of the melted solder from the periphery toward the center of the base substrate 3 is stopped at the slits 110b. Therefore, the solder fillets 9 for inspection of the mounting condition are produced on the side surfaces of the package with high reliability.

Further, since the coating layers 11 comprising a ceramic material, i.e., alumina, serve as masks for selective plating of the Au layer 110, it is not necessary to form a mask for the selective plating. Consequently, the production cost of the base substrate 3 is reduced.

FIG. 3(d) is a sectional view of a part of a semiconductor package according to a variation of the third embodiment. While in the above-described third embodiment portions of the plated Ni layer 112 exposed at the slits 110b of the plated Au layer 110 are covered with the alumina layers 11, portions of the metallized layer 111 exposed at the slits 110b may be covered with the alumina layers 11 as shown in FIG. 3(d). In production, the plated Ni layer 112 is formed so that it has the same pattern as the plated Au layer 110, whereby the metallized layer 111 is exposed at the slits 110b of the plated Au layer 110. In this case, the alumina layers 11 serve as masks for selective plating of the Ni layer 112 and the Au layer 110.

[Embodiment 4]

Figure 4:
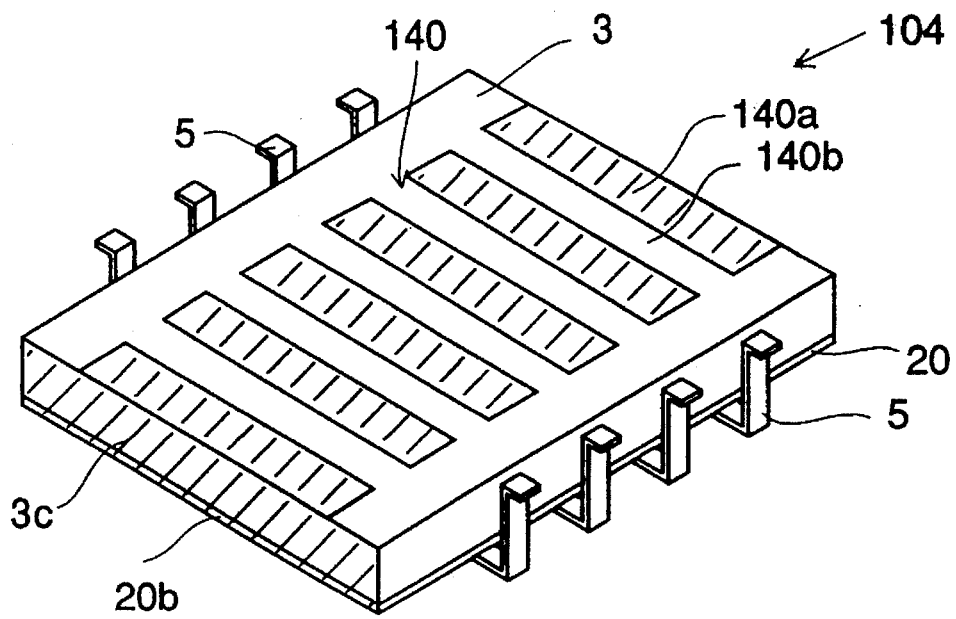
FIG. 4 is a perspective view of a semiconductor package in accordance with a fourth embodiment of the present invention, viewed from its rear surface.

FIG. 4 is a perspective view of a semiconductor package 104 according to a fourth embodiment of the present invention, viewed from its rear surface. In the figure, the same reference numerals as in FIG. 1(a) designate the same or corresponding parts. Reference numeral 140 designates a metal pattern for soldering disposed on the rear surface of the base substrate 3. The metal pattern 140 comprises a plurality of stripe-shaped plated Au films 140a and a plurality of stripe-shaped portions of the ceramic base layer 3 where Au is not plated, which are alternatingly arranged in the direction parallel to the sides of the base substrate 3 where the external lead terminals 5 are present. As in the above-described first embodiment, the plated Au films 140a abuts the opposite side surfaces of the base substrate 3 where the external lead terminals 5 are absent.

In this fourth embodiment of the invention, since the plated Au films 140a having good adhesion to solder and the ceramic portions 140b of the base substrate 3 having poor adhesion to solder are alternatingly arranged, the flow of the melted solder from the periphery toward the center of the base substrate 3 is stopped at the ceramic portions 140b, with further effect compared to the above-described first to third embodiments.

[Embodiment 5]

Figure 5:
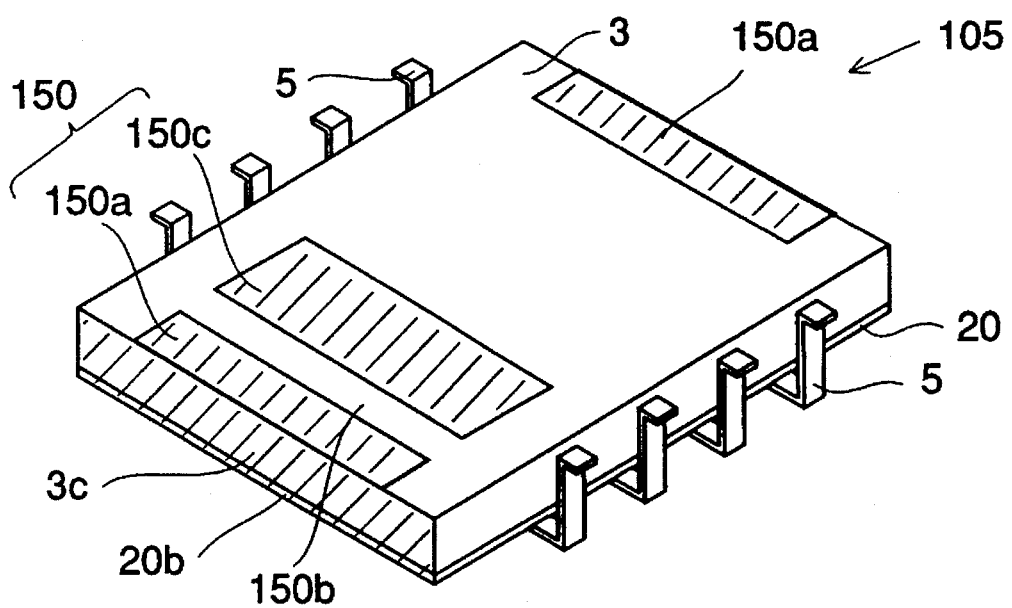
FIG. 5 is a perspective view illustrating a semiconductor package in accordance with a fifth embodiment of the present invention, viewed from its rear surface.

FIG. 5 is a perspective view of a semiconductor package 105 according to a fifth embodiment of the present invention, viewed from its rear surface. In the figure, the same reference numerals as in FIG. 1(a) designate the same or corresponding parts. Reference numeral 150 designates a metal pattern for soldering disposed on the rear surface of the base substrate 3. The metal pattern 150 comprises plated Au films 150a abutting opposite side surfaces of the base substrate 3 where the external lead terminals 5 are absent, and a plated Au film 150c for heat radiation disposed opposite a chip region on the front surface of the base substrate 3. The plated Ni layer and the metallized layer (not shown) disposed under the plated Au layer 150 have the same pattern as the Au layer 150. In addition, the ceramic base substrate 3 having poor adhesion to solder is exposed at portions between the plated Au film. 150c and the plated Au films 150a.

In this fifth embodiment of the invention, in addition to the plated Au films 150a disposed on the opposite ends of the rear surface of the package body, the plated Au film 150c for radiation of heat produced in the semiconductor chip is disposed opposite the chip region on the front surface of the package body. Therefore, as in the above-described first embodiment, when the package is mounted on a package substrate, solder fillets are surely produced at the opposite sides of the package. In addition, the heat radiation of the semiconductor chip is improved.

[Embodiment 6]

Figure 6:
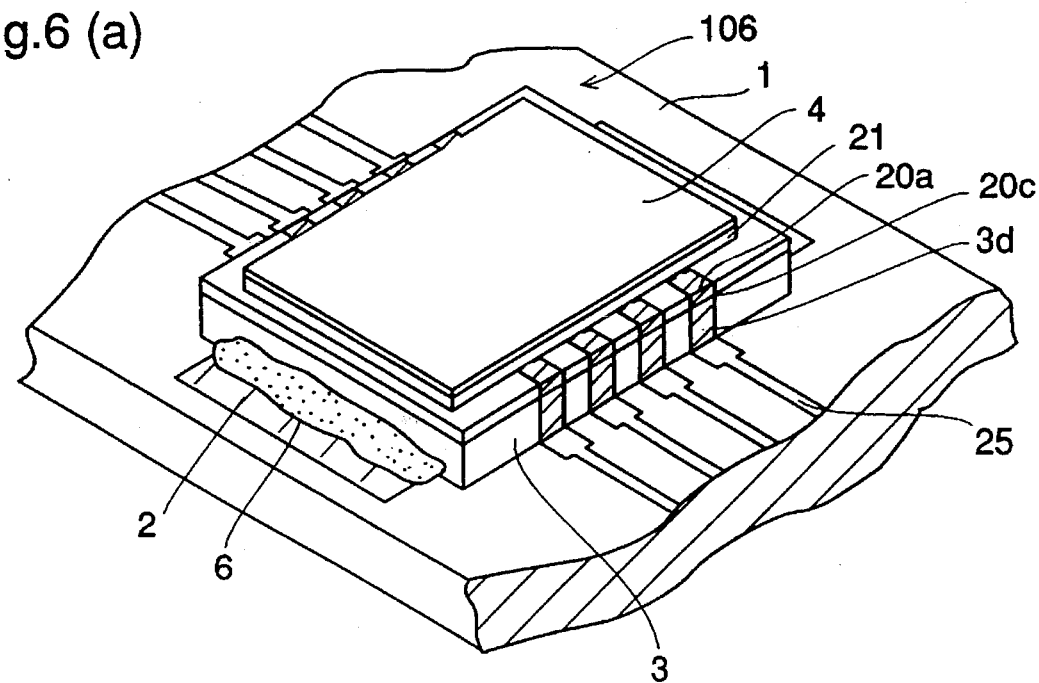
FIGS. 6(a) and 6(b) are perspective views of a semiconductor package in accordance with a sixth embodiment of the present invention, viewed from its front and rear surfaces, respectively.
Figure 6:
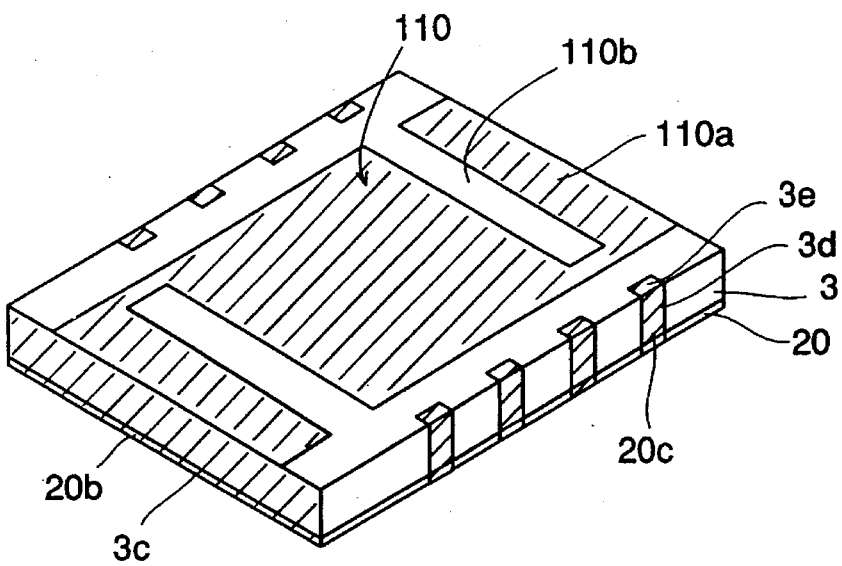
Figure 7:
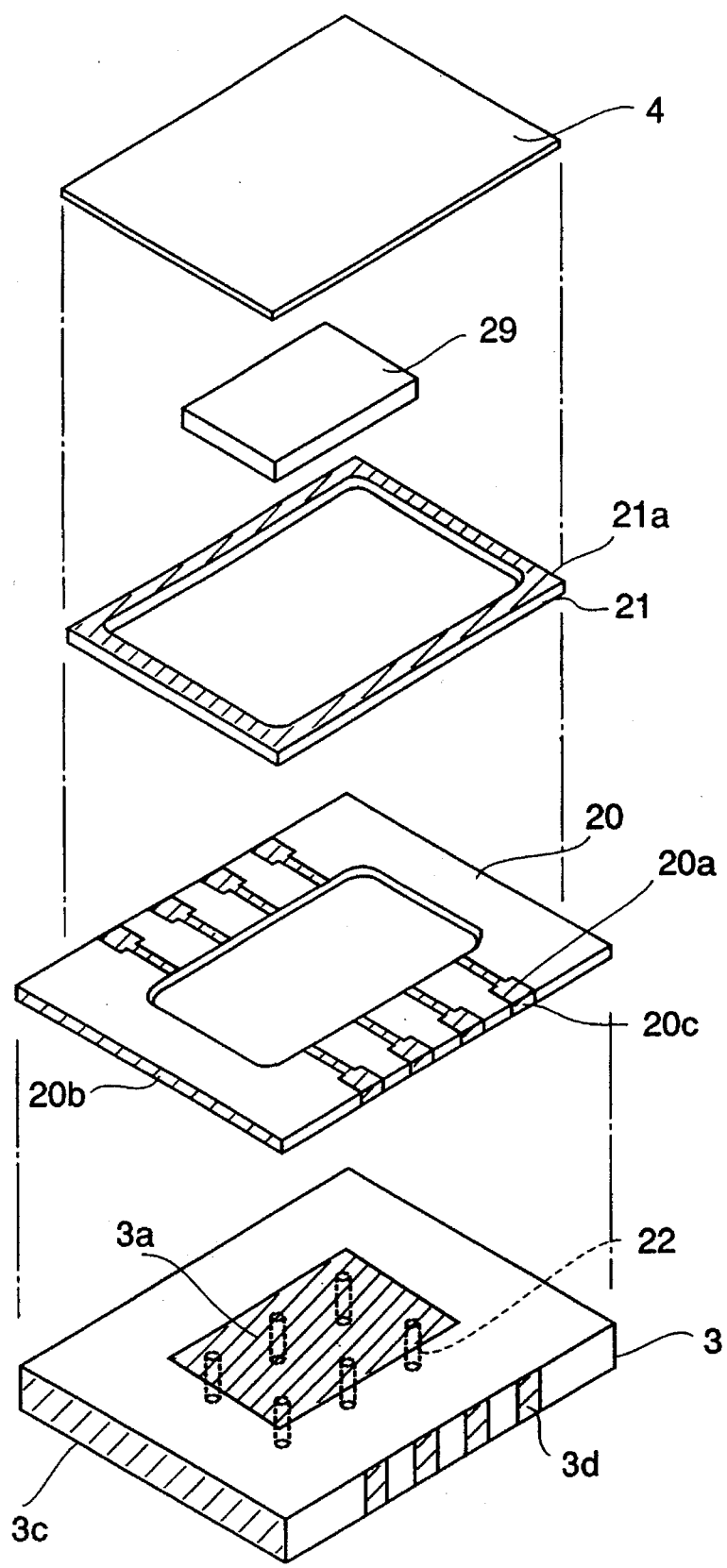
FIG. 7 is an exploded perspective view of the semiconductor package according to the sixth embodiment of the invention.

FIGS. 6(a) and 6(b) are diagrams illustrating a semiconductor package in accordance with a sixth embodiment of the present invention, in which FIG. 6(a) is a perspective view of the semiconductor package 106 mounted on a package substrate, and FIG. 6(b) is a perspective view of the semiconductor package viewed from its rear surface. FIG. 7 is an exploded perspective view of the semiconductor package.

In the figures, the same reference numerals as in FIGS. 1(a)–1(c) designate the same or corresponding parts. The semiconductor package 106 of this sixth embodiment is identical to the semiconductor package 101 according to the first embodiment except that a plurality of conductive layers for electrical connection are employed in place of the external lead terminals 5.

More specifically, a plurality of first conductive layers 3d are disposed on opposite sides of the base substrate 3, and a plurality of second conductive layers 3e are disposed on the rear surface of the base substrate 3, contacting the respective first conductive layers 3d. A plurality of third conductive layers 20c are disposed on opposite sides of the first ceramic frame 20 on the front surface of the base substrate 3, contacting the respective second conductive layers 3d. A plurality of fourth conductive layers 20a are disposed on the front surface of the ceramic frame 20, contacting the respective third conductive layers 20c. These conductive layers 20a, 20c, 3d, and 3e are electrically connected to each other.

In this sixth embodiment of the present invention, since the conductive layers extending from the front surface of the ceramic frame 20 to the rear surface of the base substrate 3 through the side surface of the base substrate 3 are employed in place of the external lead terminals 5, the size of the semiconductor package is reduced compared to the semiconductor package employing the external lead terminals.

[Embodiment 7]

Figure 8A:
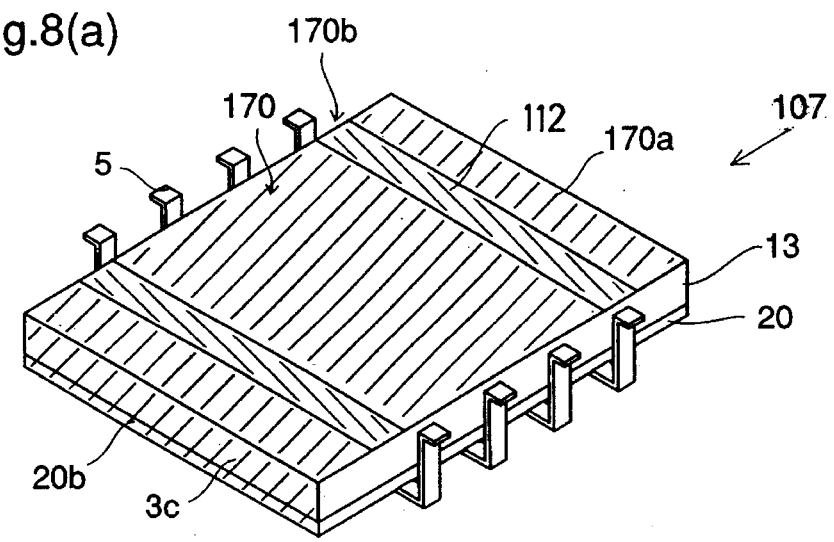
Figure 8B:
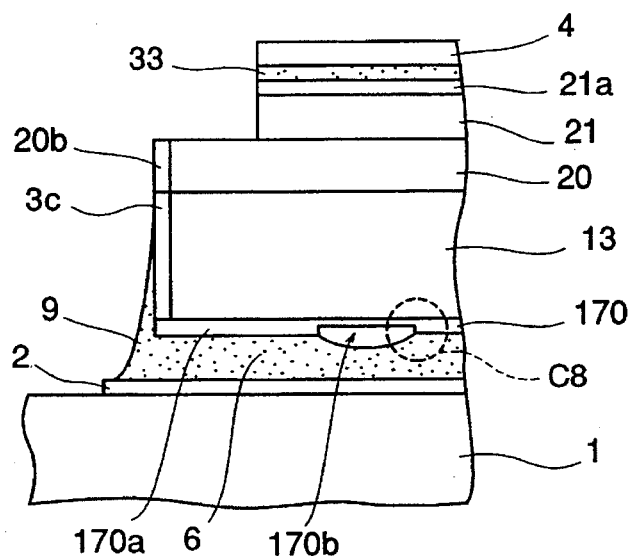
Figure 8C:
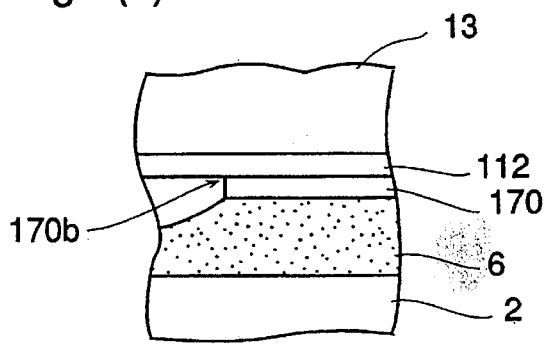
Figure 8D:
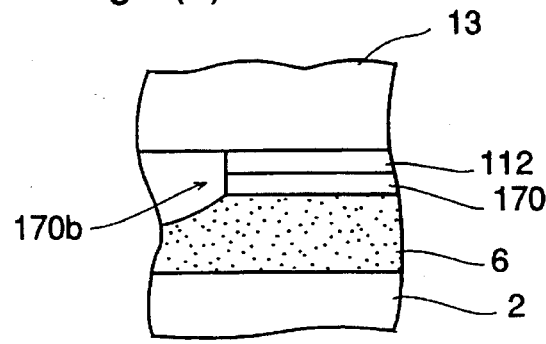

FIGS. 8(a)–8(c) are diagrams illustrating a semiconductor package in accordance with a seventh embodiment of the present invention, in which FIG. 8(a) a perspective view of the semiconductor package 107 viewed from its rear surface, FIG. 8(b) is a sectional view of a part of the semiconductor package in the vicinity of a junction between the package and a package substrate, and FIG. 8(c) is an enlarged view of a part of a metal layer for soldering disposed on the rear surface of the semiconductor package, which part is denoted by C8 in FIG. 8(b). In addition, FIG. 8(d) is a diagram for explaining a variation of the seventh embodiment.

In the figures, the same reference numerals as in FIGS. 1(a)–1(c) designate the same or corresponding parts. In this seventh embodiment, a metal base substrate 13 comprising Cu, Cu-W, Fe-Ni-Co, or the like is employed in place of the ceramic base substrate 3 of the first embodiment. On the rear surface of the metal base substrate 13, a plated Ni layer 112 is disposed over the entire surface, and a plated Au layer 170 having a prescribed pattern is disposed on the plated Ni layer 112. The plated Au layer 170 has portions 170a abutting the opposite side surfaces of the base substrate 3 where the external lead terminals 5 are absent, and slits 170b abutting the respective Au portions 170a. In the slits 170b, the plated Ni layer 112 is exposed.

In the above-described first to sixth embodiments of the invention, since the base substrate 3 comprises an insulating material, conductive layers for grounding of the semiconductor chip are disposed on the front and rear surfaces of the base substrate and through-holes connecting the front and rear side conductive layers are formed through the base substrate. In this seventh embodiment of the invention, however, since the base substrate 13 comprises metal, the grounding conductors and the through-holes are dispensed with. Consequently, the processing of the base substrate can be simplified.

Further, since the plated Au layer 170 for soldering is disposed on the rear surface of the metal base substrate 13 via the plated Ni layer 112, the adhesive strength between the plated Au layer 170 and the rear surface of the semiconductor package is increased by the plated Ni layer 112.

FIG. 8(d) is a sectional view of a part of a semiconductor package according to a variation of the seventh embodiment. While in the above-described seventh embodiment the plated Ni layer 112 is exposed at the slits 170b of the plated Au layer 170, the metal base substrate 13 may be exposed at the slits 170b as shown in FIG. 8(d). In this case, the plated Ni layer 112 is formed so that it has the same pattern as the plated Au layer 170, whereby the metal base substrate 13 is exposed at the slits 170b.

[Embodiment 8]

Figure 9:
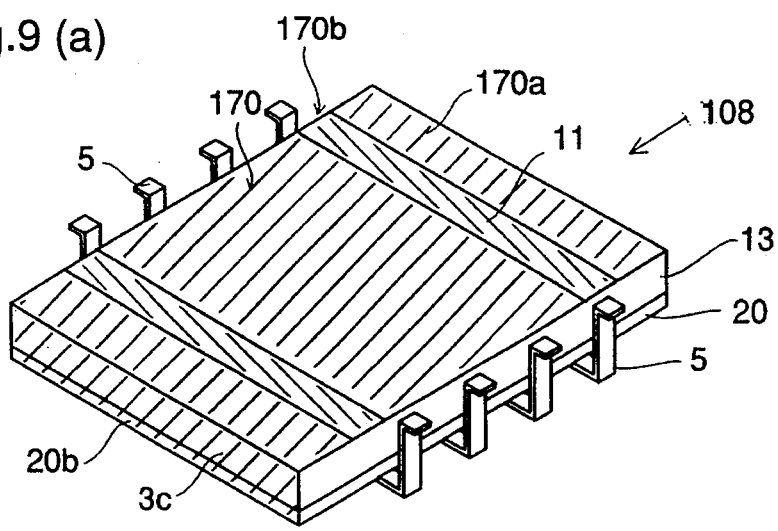
Figure 9:
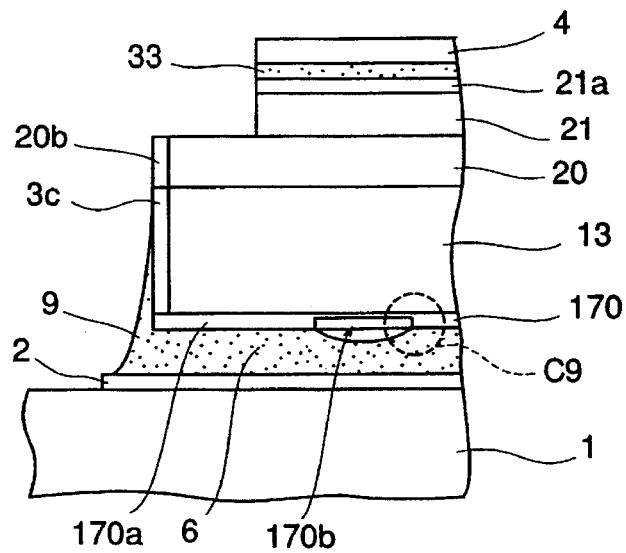
Figure 9:
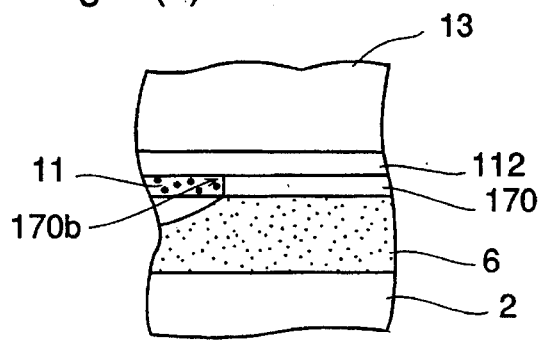
Figure 9:
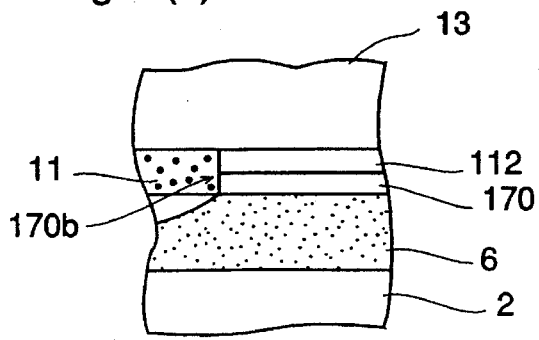
Figure 10:
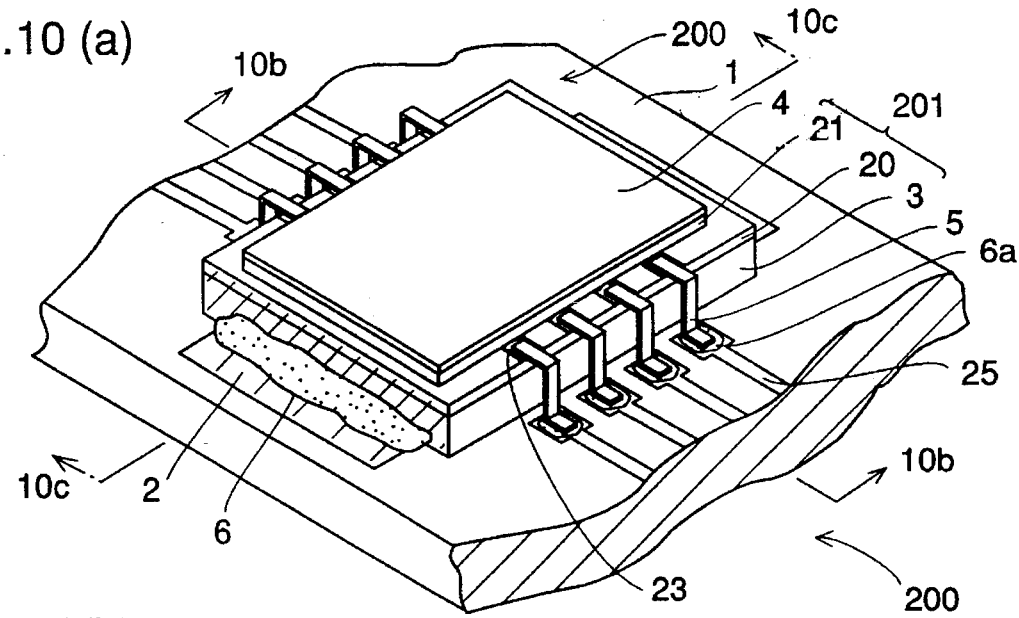
Figure 10:
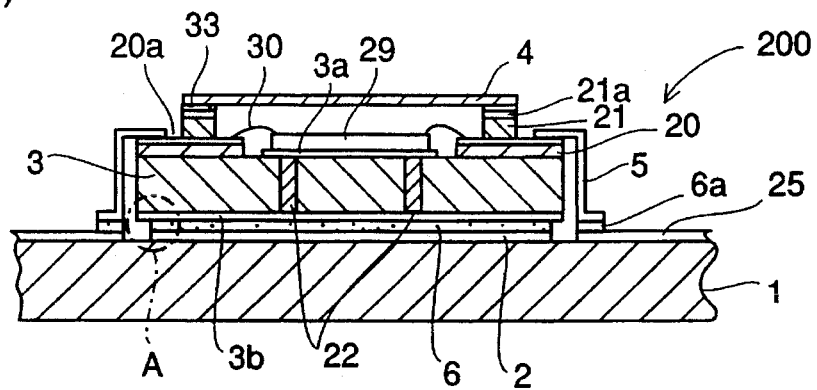
Figure 10:
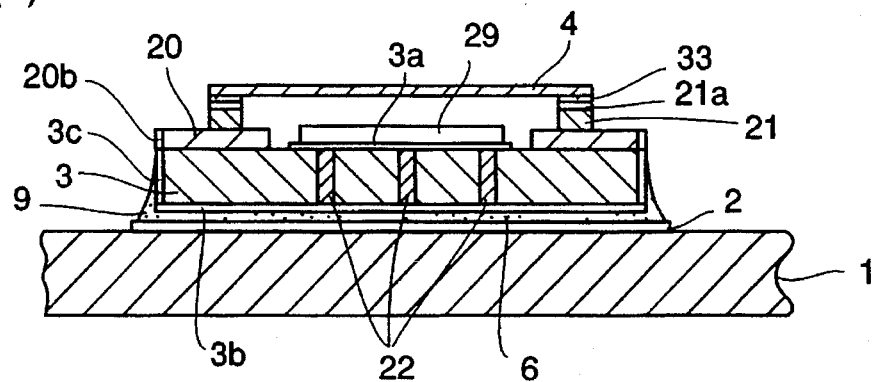
Figure 11:
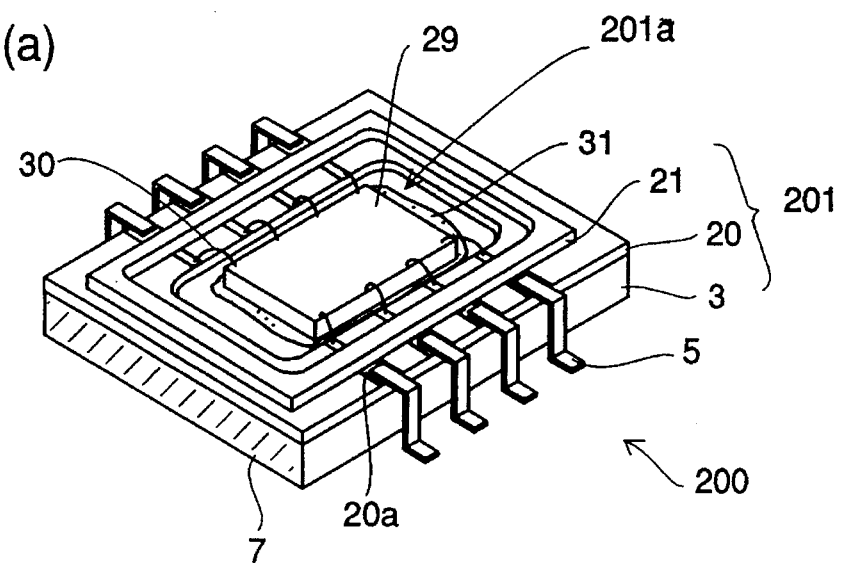
Figure 11:
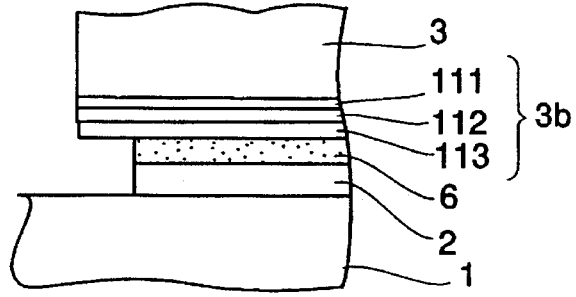
Figure 11:
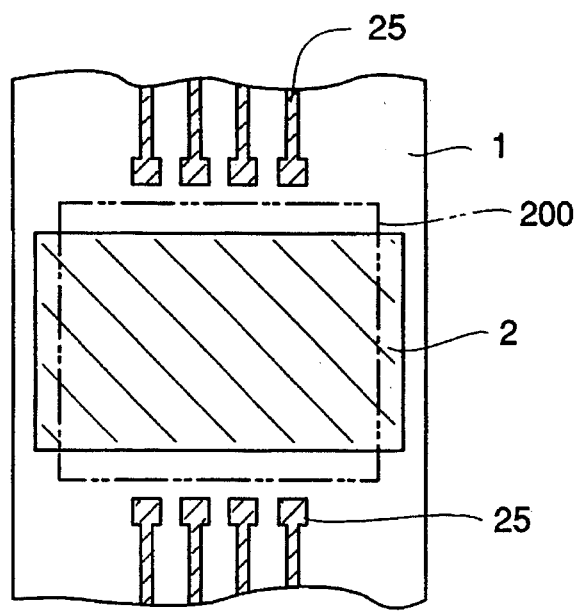
Figure 12:
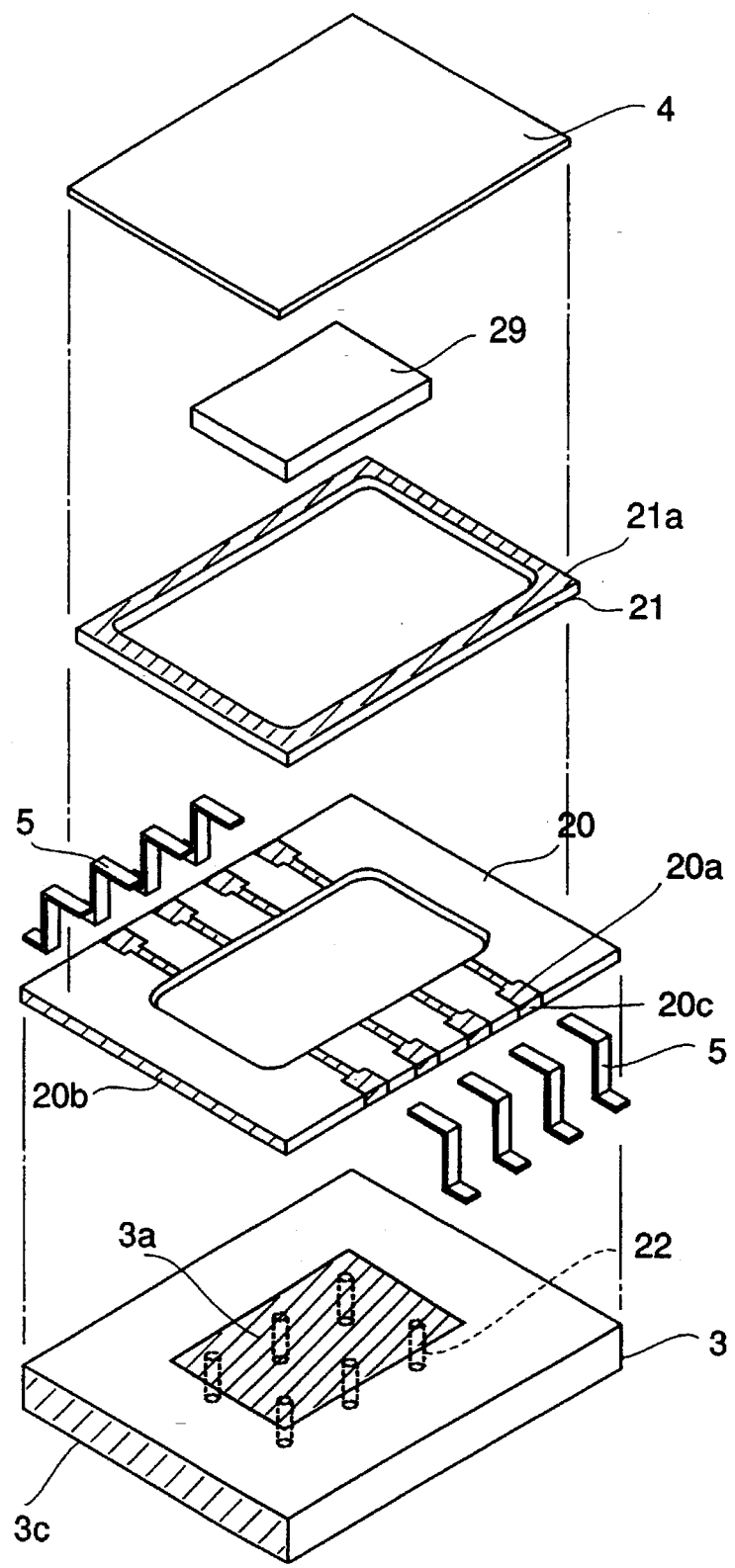
FIG. 12 is an exploded perspective view of the semiconductor package shown in FIG. 11(a).
Figure 13:
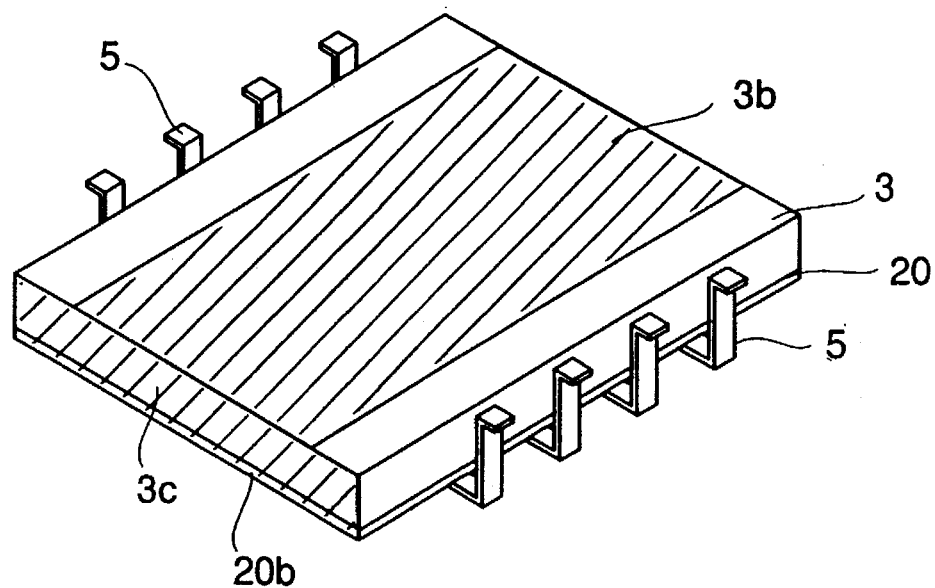
FIG. 13(a) is a perspective view of the prior art semiconductor package viewed from its rear surface.
FIG. 13(b) is a sectional view of a part of the semiconductor package for explaining a problem of the prior art semiconductor package.
Figure 13:
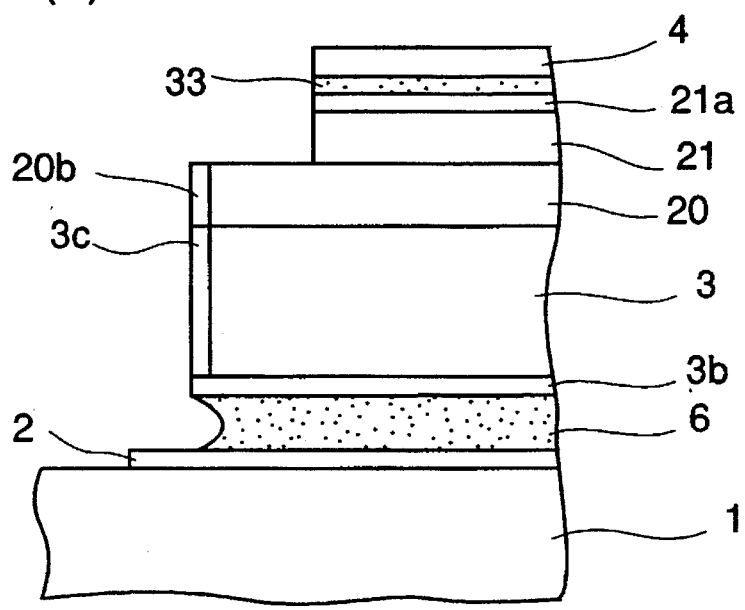

FIGS. 9(a)–9(c) are diagrams illustrating a semiconductor package in accordance with an eighth embodiment of the present invention, in which FIG. 9(a) is a perspective view of the semiconductor package 108 viewed from its rear surface, FIG. 9(b) is a sectional view of a part of the package in the vicinity of a junction between the package and a package substrate, and FIG. 9(c) is an enlarged view of a part of a metal layer for soldering disposed on the rear surface of the semiconductor package, which part is denoted by C9 in FIG. 9(b). In addition, FIG. 9(d) is a diagram for explaining a variation of the eighth embodiment.

In the figures, the same reference numerals as in FIGS. 8(a)–8(d) designate the same or corresponding parts. In this eighth embodiment of the invention, as in the above-described seventh embodiment, a plated Ni layer 112 and a plated Au layer 170 (metal layer for soldering) having slits 170b are disposed on the rear surface of the base substrate 13 of the semiconductor package 108. In addition, alumina layers 11 are disposed on portions of the plated Ni layer 112 exposed at the slits 170b of the plated Au layer 170.

In this eighth embodiment of the invention, since the alumina layers 11 having poor adhesion to solder are exposed at the slits 170b of the plated Au layer 170, when the package is mounted on a package substrate, the flow of the melted solder from the periphery toward the center of the base substrate 3 is stopped at the slits 170b. Therefore, solder fillets 9 are surely formed on the opposite sides of the package where the external lead terminals 5 are not connected.

Further, since the coating layers 11 comprising a ceramic material, i.e., alumina, serve as masks for selective plating of the Au layer 170, it is not necessary to form a mask for the selective plating. Consequently, the production cost of the base substrate can be reduced.

FIG. 9(d) is a sectional view of a part of a semiconductor package according to a variation of the eight embodiment. While in the above-described eighth embodiment portions of the plated Ni layer 112 exposed at the slits 170b of the plated Au layer 170 are covered with the alumina layers 11, portions of the metal base substrate 13 exposed at the slits 170b may be covered with the alumina layers 11 as shown in FIG. 9(d). In production, the plated Ni layer 112 is formed so that it has the same pattern as the plated Au layer 170, whereby the metal base substrate 13 is exposed at the slits 170b of the plated Au layer 170. In this case, the alumina layers 11 serve as masks for selective plating of the Ni layer 112 and the Au layer 110.

What is claimed is:

1. A semiconductor package comprising:
   a package body having opposite front and rear surfaces and four side surfaces;
   a semiconductor chip disposed on the front surface of the package body;
   a plurality of external connection members for electrically connecting the semiconductor chip with external elements, the external connection members being disposed on two opposite side surfaces of the package body;
   a lid hermetically sealing and shielding the semiconductor chip in the package body;
   a package substrate having a metallized region on which the semiconductor package is mounted; and
   a metal layer disposed on a rear surface of the package substrate and connected to the metallized region of the package substrate with solder, the metal layer comprising a material having good adhesion to the solder, having a pattern in which portions of the metal layer abut two opposite side surfaces of the package body where the external connection members are absent, and having openings that abut the respective metal layer portions.

2. The semiconductor package of claim 1 comprising:
   a metallized layer on the rear surface of the package body, the metallized layer having a pattern in which stripe-shaped portions of the metallized layer abut the two opposite side surfaces of the package body where the external connection members are absent, stripe-shaped openings abutting the respective portions of the metallized layer at inner sides that are not in contact with the side surfaces of the package body; and
   an Ni layer selectively plated on the metallized layer wherein the metal layer connected to the metallized region of the package substrate comprises an Au layer selectively plated on the Ni layer.

3. The semiconductor package of claim 1 wherein the package body comprises:
   a base substrate having opposite front and rear surfaces and a plurality of electrically conducting via-holes;
   first and second conductive layers for grounding disposed on the front and rear surfaces of the base substrate, respectively, and electrically connected to each other by the via-holes in the base substrate, the semiconductor chip being disposed on the first conductive layer;
   a first insulating frame having an inner edge and an outer edge, disposed on the front surface of the base substrate, and surrounding the semiconductor chip;
   a plurality of spaced apart conducting layers disposed on the first insulating frame, extending from the inner edge to the outer edge of the first insulating frame; and
   a second insulating frame disposed on the first insulating frame and bearing a metal film wherein each of the external connection members is connected to a respective one of the conducting layers on the first insulating frame and the lid is fixed to the metal film on the second insulating frame with solder.

4. The semiconductor package of claim 3 wherein the base substrate comprises AlN or $Al_2O_3$, the first and second insulating frames comprise a ceramic material, and the conducting layers to which the external connection members are connected are disposed on two opposite and parallel parts of the first insulating frame.

5. The semiconductor package of claim 1 comprising:
   a metallized layer over the rear surface of the package body; and
   a plated Ni layer disposed over the metallized layer wherein the metal layer connected to the metallized region of the package substrate comprises an Au layer selectively plated on the Ni layer.

6. The semiconductor package of claim 1 comprising:
   a metallized layer over the rear surface of the package body; and
   an Ni layer selectively plated on the metallized layer and having a pattern in which stripe-shaped portions of the plated Ni layer abut the two opposite side surfaces of the package body where the external connection members are absent and stripe-shaped openings that abut respective portions of the plated Ni layer at inner sides that are not in contact with the side surfaces of the package body wherein the metal layer connected to the metallized region of the package substrate comprises an Au layer selectively plated on the plated Ni layer.

7. The semiconductor package of claim 5 wherein portions of the plated Ni layer exposed in the openings are coated with a ceramic material.

8. The semiconductor package of claim 6 wherein portions of the metallized layer exposed in the openings are coated with a ceramic material.

9. The semiconductor package of claim 1 wherein the metal layer on the rear surface of the package body has a pattern in which a plurality of stripe-shaped metal portions and a plurality of stripe-shaped openings are alternatingly arranged in a direction parallel to the opposite side surfaces of the package body where the external connection members are present, and the stripe-shaped metal portions abut the opposite side surfaces of the package body where the external connection members are absent.

10. The semiconductor package of claim 1 wherein the metal layer on the rear surface of the package body includes a metal portion disposed opposite the semiconductor chip on the front surface of the package body for radiating heat generated in the semiconductor chip.

11. The semiconductor package of claim 1 wherein the external connection members are conductive layers extending from the front surface to the rear surface of the package body through the side surface of the package body.

12. The semiconductor package of claim 1 wherein the package body comprises:

a base substrate comprising a metal and having a front surface on which the semiconductor chip is disposed and a rear surface;

a first insulating frame having an inner edge and an outer edge, disposed on the front surface of the base substrate, and surrounding the semiconductor chip;

a plurality of spaced apart conducting layers extending from the inner edge to the outer edge of the first insulating frame; and a second insulating frame disposed on the first insulating frame and bearing a metal film wherein each of the external connection members is connected to a respective one of the conducting layers on the first insulating frame and the lid is fixed to the metal film on the second insulating frame with solder.

13. The semiconductor package of claim 12 wherein the base substrate is selected from the group consisting of Cu, Cu-W alloy, and Fe-Ni-Co alloy.

14. The semiconductor package of claim 13 comprising a plated Ni layer disposed over the rear surface of the base substrate wherein the metal layer connected to the metallized region of the package substrate comprises an Au layer selectively plated on the plated Ni layer.

15. The semiconductor package of claim 13 comprising an Ni layer selectively plated on the rear surface of the base substrate and having a pattern in which stripe-shaped portions of the plated Ni layer abut the two opposite side surfaces of the package body where the external connection members are absent and stripe-shaped openings that abut respective portions of the plated Ni layer at inner sides that are not in contact with the side surfaces of the package body wherein the metal layer connected to the metallized region of the package substrate comprises an Au layer selectively plated on the plated Ni layer.

16. The semiconductor package of claim 14 wherein portions of the plated Ni layer exposed in the openings on the plated Au layer are coated with a ceramic material.

17. The semiconductor package of claim 15 wherein portions of the base substrate exposed in the opening on the plated Au layer are coated with a ceramic material.

* * * * *